United States Patent
Liu (10) Patent No.: US 11,227,642 B2
(45) Date of Patent: Jan. 18, 2022

(54) MEMORY CONTROLLER, METHOD FOR READ CONTROL OF MEMORY, AND ASSOCIATED STORAGE SYSTEM

(71) Applicant: SigmaStar Technology Ltd., Fujian (CN)

(72) Inventor: Hsian-Feng Liu, Taichung (TW)

(73) Assignee: SigmaStar Technology Ltd., Fujian (CN)

(\*) Notice: Subject to any disclaimer, the term of this patent is extended or adjusted under 35 U.S.C. 154(b) by 41 days.

(21) Appl. No.: 16/937,539

(22) Filed: Jul. 23, 2020

(65) Prior Publication Data

US 2021/0035618 A1 Feb. 4, 2021

(51) Int. Cl.
*G11C 7/22* (2006.01)
*G11C 8/18* (2006.01)
*G11C 7/10* (2006.01)

(52) U.S. Cl.
CPC .............. *G11C 7/222* (2013.01); *G11C 7/106* (2013.01); *G11C 7/1087* (2013.01); *G11C 8/18* (2013.01)

(58) Field of Classification Search
CPC ...................................................... G11C 7/222
USPC ...................................................... 365/233.1
See application file for complete search history.

(56) References Cited

U.S. PATENT DOCUMENTS

| | | | | |
|---|---|---|---|---|
| 5,384,745 A | * | 1/1995 | Konishi | G11C 7/10 365/193 |
| 5,521,878 A | * | 5/1996 | Ohtani | G11C 7/103 365/233.1 |
| 6,918,016 B1 | | 7/2005 | Magro | |
| 7,826,281 B2 | | 11/2010 | Nakashima | |
| 7,843,763 B2 | | 11/2010 | Lee | |
| 8,750,055 B2 | * | 6/2014 | Kim | G11C 7/222 365/189.14 |
| 9,378,804 B2 | | 6/2016 | Iijima | |
| 2002/0112119 A1 | * | 8/2002 | Halbert | G11C 5/025 711/115 |
| 2006/0262586 A1 | | 11/2006 | Solomon | |

\* cited by examiner

*Primary Examiner* — Muna A Techane
(74) *Attorney, Agent, or Firm* — Winston Hsu (57) ABSTRACT

A memory controller, a method for read control of a memory, and an associated storage system are provided. The memory controller includes a data latch circuit, a mask generating circuit, a clock control logic electrically coupled to the mask generating circuit, and a demultiplexer electrically coupled to the data latch circuit and the clock control logic. The data latch circuit latches a series of data within a data signal from the memory according to a data strobe signal from the memory. The mask generating circuit generates a mask signal according to the data strobe signal. The clock control logic generates a receiving clock signal according to the mask signal. The demultiplexer determines valid data within the series of data with aid of the receiving clock signal.

20 Claims, 5 Drawing Sheets

MEMORY CONTROLLER, METHOD FOR READ CONTROL OF MEMORY, AND ASSOCIATED STORAGE SYSTEM

BACKGROUND OF THE INVENTION

1. Field of the Invention

The present invention is related to read control of memories, and more particularly, to a memory controller, a method for read control of a memory, and an associated storage system.

2. Description of the Prior Art

When a memory controller accesses a double data rate (DDR) memory (e.g. a DDR synchronous dynamic random access memory (SDRAM)), for a purpose of determining timing of accessing data, the data to be accessed will be transmitted in conjunction with a data strobe signal between the memory controller and the DDR memory. Taking a read operation as an example, when the memory controller reads valid data within a data signal from the DDR memory, not only is a periodic clock signal that is capable of latching the valid data included in the data strobe signal received by the memory controller, but some glitch signals also exist at time points before and after the periodic signal. If the memory controller directly uses the data strobe signal to latch the data signal, latched data might have problems due to these glitch signals. For example, the problems resulting from glitch signals may include bit count errors, data content errors, etc.

Thus, in each read operation, if the memory controller utilizes a mask signal to clearly define a valid interval of the data strobe signal in this read operation, the memory controller may utilize the mask signal to perform gating upon the data strobe signal first for generating a latch signal without those glitch signals, and further utilize the latch signal to latch the valid data. The aforementioned manner of performing gating first may introduce an additional delay for the latch signal, however, so the data signal has to be applied a same delay to allow the memory controller to latch correct data.

The additional delay caused by this method results in poor read performance of the memory.

SUMMARY OF THE INVENTION

An objective of the present invention provides a memory controller, a method for read control of a memory, and an associated storage system, to solve the problem of valid data being delayed.

At least one embodiment of the present invention provides a memory controller. The memory controller comprises a data latch circuit, a mask generating circuit, a clock control logic electrically coupled to the mask generating circuit, and a demultiplexer electrically coupled to the data latch circuit and the clock control logic. The data latch circuit may be configured to latch a series of data within a data signal from a memory according to a data strobe signal from the memory, the mask generating circuit may be configured to generate a mask signal according to the data strobe signal, the clock control logic may be configured to generate a receiving clock signal according to the mask signal, and the demultiplexer may be configured to determine valid data within the series of data with aid of the receiving clock signal.

At least one embodiment of the present invention provides a method for read control of a memory. The method comprises: receiving a data strobe signal and a data signal from a memory; latching a series of data within the data signal according to the data strobe signal; generating a mask signal according to the data strobe signal; generating a receiving clock signal according to the mask signal; and determining valid data within the series of data with aid of the receiving clock signal.

At least one embodiment of the present invention provides a storage system, wherein the storage system comprises a memory and a memory controller electrically coupled to the memory. The memory may be configured to store data, and the memory controller may be configured to perform read control of the memory. More particularly, the memory controller comprises a data latch circuit, a mask generating circuit, a clock control logic electrically coupled to the mask generating circuit, and a demultiplexer electrically coupled to the data latch circuit and the clock control logic. The data latch circuit may be configured to latch a series of data within a data signal from the memory according to a data strobe signal from the memory, the mask generating circuit may be configured to generate a mask signal according to the data strobe signal, the clock control logic may be configured to generate a receiving clock signal according to the mask signal, and the demultiplexer may be configured to determine valid data within the series of data with aid of the receiving clock signal.

The memory controller and the method for read control provided by embodiments of the present invention directly use a data latch circuit to latch a series of data within a data signal, and further use a mask signal to select valid data in the step of reducing a data rate. As the memory controller does not need to use the mask signal for performing gating upon the data strobe signal before latching the series of data, the present invention can solve the problem of generating additional data delay in the related art. In addition, timing of the mask signal generated by the memory controller of the present invention can have more tolerance in comparison with the related art. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
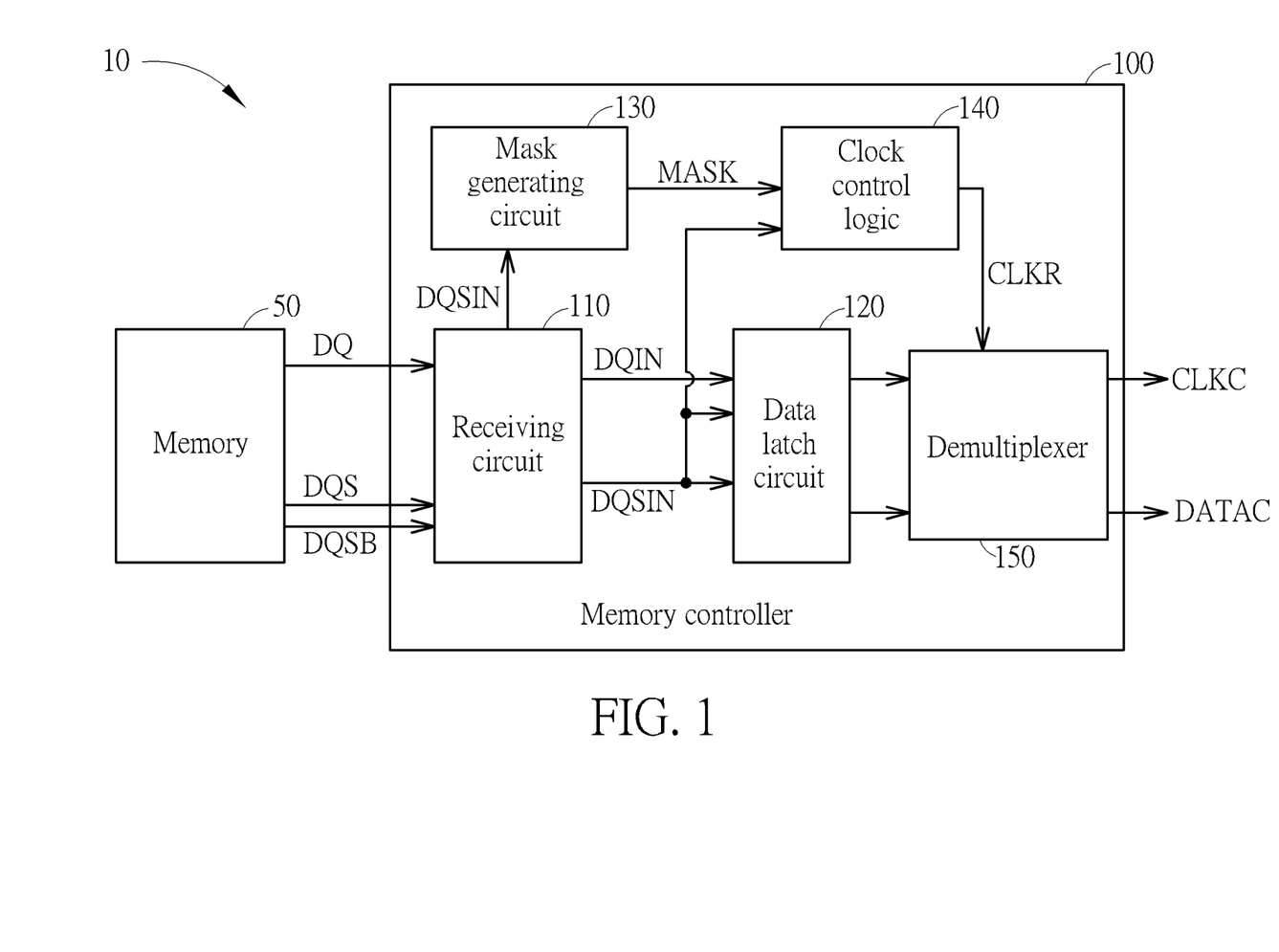
FIG. 1 is a diagram illustrating a storage system according to an embodiment of the present invention.

FIG. 1 is a diagram illustrating a storage system 10 according to an embodiment of the present invention. The storage system 10 may comprise a memory 50 and a memory controller 100 electrically coupled to the memory 50, where the memory 50 may be configured to store data, and the memory controller may be configured to perform read control of the memory 50. Examples of the memory 50 may include, but are not limited to, a dynamic random access memory (DRAM) such as a synchronous DRAM (SDRAM).

As shown in FIG. 1, the memory controller 100 may comprise a receiving circuit 110, a data latch circuit 120, a mask generating circuit 130, a clock control logic 140 and a demultiplexer 150 (e.g. a decelerating (or speed-down) demultiplexer). The receiving circuit 110 may be configured to receive data strobe signals {DQS, DQSB} and a data signal DQ, where the data strobe signals {DQS, DQSB} are a pair of differential signals, but the present invention is not limited thereto. The receiving circuit 110 may perform pre-processing (e.g. amplifying and delaying) upon the data strobe signals {DQS, DQSB} and the data signal DQ, and accordingly generate a data strobe signal DQSIN and a data signal DQIN for the data latch circuit 120. The data latch circuit 120 may be configured to latch a series of data within a data signal from the memory 50 (more particularly, the data signal DQIN which is generated after being received and processed by the receiving circuit 110) according to a data strobe signal from the memory (more particularly, the data strobe signal DQSIN generated after being received and processed by the receiving circuit 110). The mask generating circuit 130 may be configured to generate a mask signal MASK according to the data strobe signal DQSIN. For example, when the storage system 10 is powered on, the memory controller 100 may control the mask generating circuit 130 to generate the mask signal MASK based on an enablement period of the data strobe signal DQSIN (e.g. one or more rising edges and/or falling edges within the enablement period), but the present invention is not limited thereto. The clock control logic 140 is electrically coupled to the mask generating circuit 130, where the clock control logic 140 may be configured to generate a receiving clock signal CLKR according to the mask signal MASK. The demultiplexer 150 is electrically coupled to the data latch circuit 120 and the clock control logic 140, where the demultiplexer 150 may be configured to determine valid data within the series of data latched by the data latch circuit 120 with aid of the receiving clock signal CLKR, and make a decelerated data signal DATAC carry the valid data, and further transmit the data signal DATAC and a corresponding clock signal CLKC together to backend circuit (s) for further usage.

Figure 2:
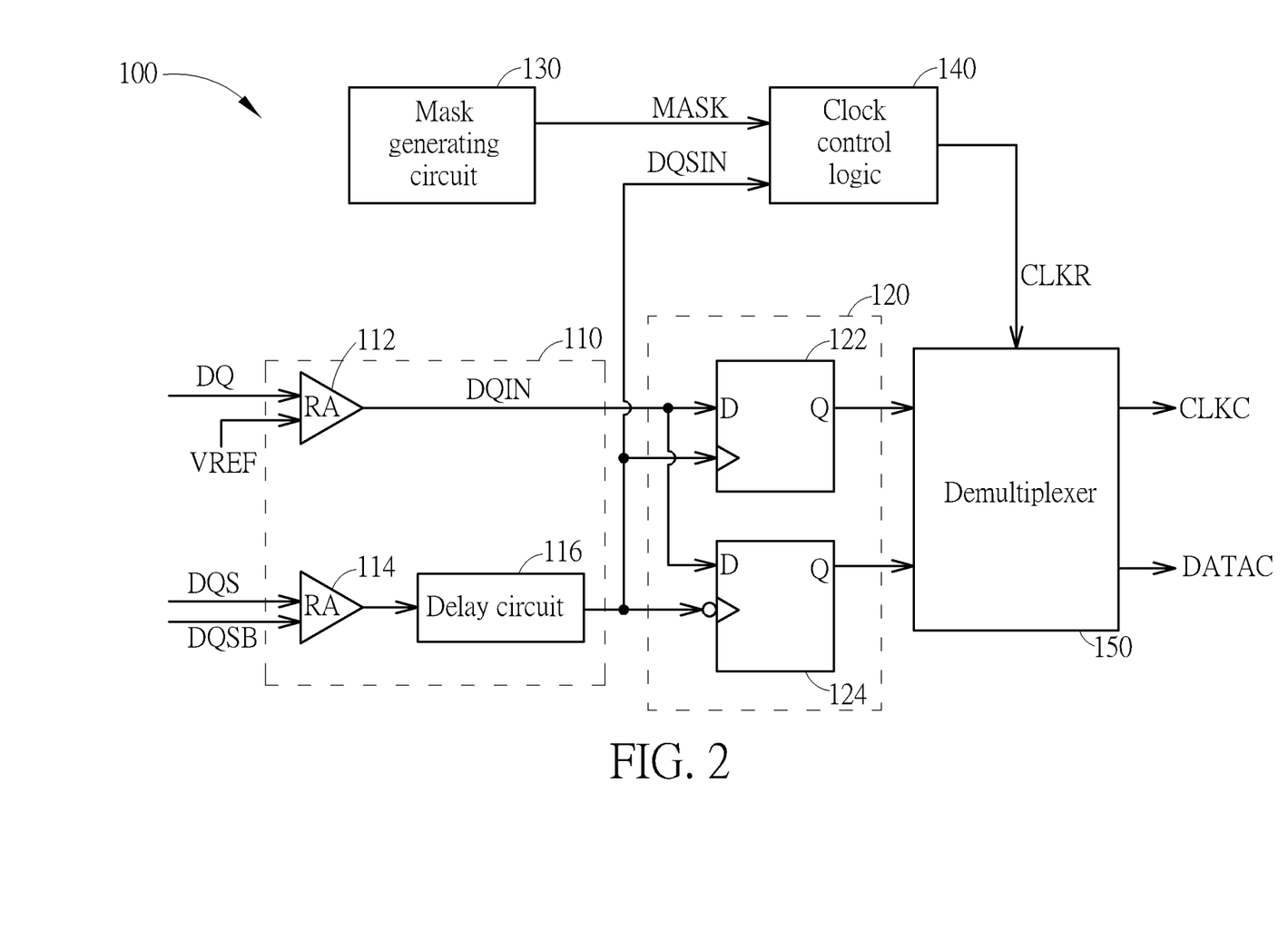
FIG. 2 is a circuit diagram illustrating a receiving circuit and a data latch circuit within a memory controller shown in FIG. 1 according to an embodiment of the present invention.

FIG. 2 is a circuit diagram illustrating the receiving circuit 110 and the data latch circuit 120 within the memory controller 100 shown in FIG. 1 according to an embodiment of the present invention. As shown in FIG. 2, the receiving circuit 110 may comprise a plurality of receiving amplifiers (RAs) 112 and 114, and a delay circuit 116. The RA 112 may amplify the data signal DQ based on a reference voltage REF to generate the data signal DQIN, and the RA 114 may amplify the data strobe signals {DQS, DQSB} and then transmit the amplifier outputs to the delay circuit 116 to generate the data strobe signal DQSIN. As the data strobe signals {DQS, DQSB} and the data signal DQ are synchronous, the delay circuit 116 may properly delay the data strobe signals {DQS, DQSB} after amplification, to try to make transition edges of the data strobe signal DQSIN (e.g. rising edges and falling edges) be positioned on a center of each bit of the data signal DQIN in order to guarantee each bit of data is properly latched, but the present invention is not limited thereto. Examples of the delay circuit 116 may include, but are not limited to, a delay locked loop (DLL).

In this embodiment, the data latch circuit 120 may latch the series of data within the data signal DQIN according to the rising edges and the falling edges of the data strobe signal DQSIN, respectively. For example, the memory controller 110 may be applied to double data rate (DDR) storage systems, e.g. DDR2 storage systems, DDR3 systems, and low power DDR (LPDDR) storage systems such as an LPDDR3 storage system and an LPDDR4 storage system. As shown in FIG. 2, the data latch circuit 120 may comprise a positive edge-triggered flip-flop 122 and a negative edge-triggered flip-flop 124. A clock terminal (which is represented by a triangle) and a data input terminal (which is labeled "D") of the positive edge-triggered 122 receive the data strobe signal DQSIN and the data signal DQIN, respectively, and the positive edge-triggered flip-flop 122 outputs latched data through an data output terminal thereof (which is labeled "Q"), where the positive edge-triggered flip-flop 122 may latch a portion of the series of data according to the rising edges of the data strobe signal DQSIN; and a clock terminal (which is represented by a triangle and a circle) and a data input terminal (which is labeled "D") of the negative edge-triggered 124 receive the data strobe signal DQSIN and the data signal DQIN, respectively, and the negative edge-triggered flip-flop 124 outputs latched data through an data output terminal thereof (which is labeled "Q"), where the negative edge-triggered flip-flop 124 may latch another portion of the series of data according to the falling edges of the data strobe signal DQSIN; but the present invention is not limited thereto. In addition, the data output terminals of the positive edge-triggered flip-flop 122 and the negative edge-triggered flip-flop 124 are both coupled to the demultiplexer 150.

Figure 3:
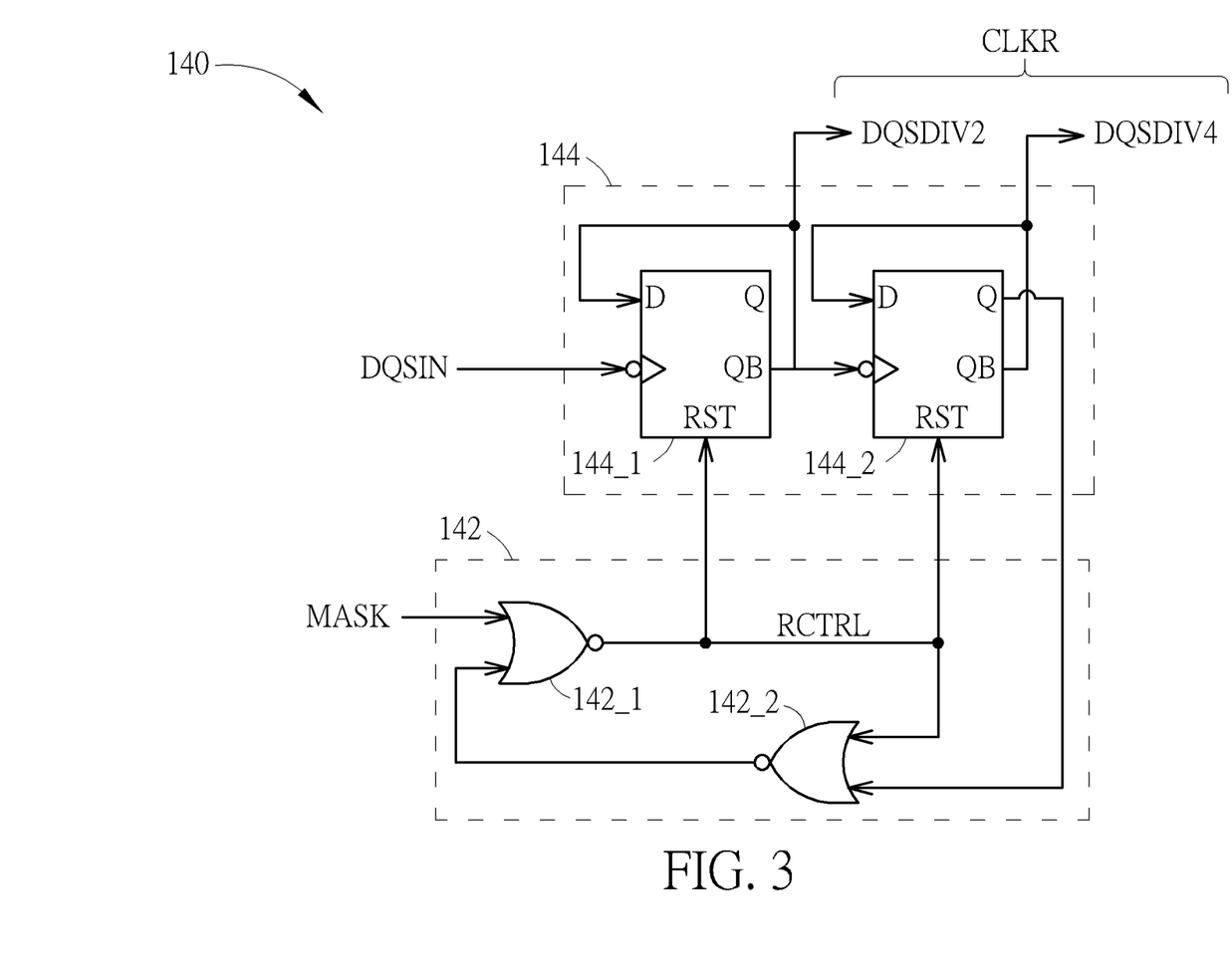
FIG. 3 is a circuit diagram illustrating a clock control logic within the memory controller shown in FIG. 2 according to an embodiment of the present invention.

FIG. 3 is a circuit diagram illustrating the clock control logic 140 shown in FIG. 2 according to an embodiment of the present invention. As shown in FIG. 3, the clock control logic 140 may comprise a decelerating control logic 142 and a decelerating circuit 144 electrically coupled to the decelerating control logic 142. In this embodiment, the decelerating control logic 142 may be configured to generate a control signal RCTRL at least according to the mask signal MASK, and the decelerating circuit 144 may generate the receiving clock signal CLKR by selectively making the data strobe signal DQSIN decelerate according to logic states (e.g. a high logic level "1" or a low logic level "0") of the control signal RCTRL. For example, in response to a first logic state of the control signal RCTRL, the decelerating circuit 144 may generate the receiving clock signal CLKR by making the data strobe signal DQSIN decelerate; and in response to a second logic state of the control signal RCTRL, the decelerating circuit 144 may control the receiving clock signal CLKR to have a fixed logic state. Such an operation of the decelerating circuit 144 is similar to clock gating.

As shown in FIG. 3, the decelerating circuit 144 may be a frequency divider, e.g. a negative edge-triggered frequency divider, where the frequency divider may be implemented by one or more flip-flops. In this embodiment, the decelerating circuit 144 may comprise a plurality of negative edge-triggered flip-flops 144_1 and 144_2, where reset terminals (which are labeled "RST") of both the negative edge-triggered flip-flops 144_1 and 144_2 may be configured to receive the control signal RCTRL. A clock terminal (which is represented by a triangle and a circle) of the negative edge-triggered flip-flop 144_1 may be configured to receive the data strobe signal DQSIN, and an inverted data output terminal (which is labeled "QB") of the negative edge-triggered flip-flop 144_1 is electrically coupled to an data input terminal (which is labeled "D") of the negative edge-triggered flip-flop 144_1. A clock terminal (which is represented by a triangle and a circle) of the negative edge-triggered flip-flop 144_2 may be electrically coupled to the inverted data output terminal (which is labeled "QB") of the negative edge-triggered flip-flop 144_1, and an inverted data output terminal (which is labeled "QB") of the negative edge-triggered flip-flop 144_2 is electrically coupled to an data input terminal (which is labeled "D") of the negative edge-triggered flip-flop 144_2. In this embodiment, when the control signal RCTRL is in the first logic state (e.g. the low logic level "0"), the decelerating circuit 144 may perform frequency division upon the data strobe signal DQSIN to generate a receiving clock signals DQSDIV2 and DQSDIV4 on the inverted data output terminals of the negative edge-triggered flip-flops 144_1 and 144_2, respectively, where the receiving clock signal DQSDIV2 is generated by dividing a frequency of the data strobe signal DQSIN by two, and the receiving clock signal DQSDIV4 is generated by dividing the frequency of the data storage signal DQSIN by four. In addition, when the control signal RCTRL is in in the second logic state (e.g. the high logic level "1"), the decelerating circuit 144 may control the receiving clock signals DQSDIV2 and DQSDIV4 to have a fixed logic state (e.g. the low logic level). In this embodiment, the receiving clock signal CLKR comprises the receiving clock signals DQSDIV2 and DQSDIV4.

As shown in FIG. 3, the decelerating control logic 142 may comprise a plurality of NOR gates 142_1 and 142_2. A first input terminal of the NOR gate 142_1 may be configured to receive the mask signal MASK, and a second input terminal of the NOR gate 142_1 may be electrically coupled to an output terminal of the NOR gate 142_2, where an output terminal of the NOR gate 142_1 may be configured to output the control signal RCTRL. A first input terminal of the NOR gate 142_2 may be configured to receive the control signal RCTRL, and a second input terminal of the NOR gate 142_2 may be electrically coupled to a data output terminal (which is labeled "Q") of the negative edge-triggered flip-flop 144_2, where a signal outputted by the data output terminal of the negative edge-triggered flip-flop 144_2 is an inverted signal of a signal (e.g. the receiving clock signal DQSDIV4) outputted by the inverted data output terminal of the negative edge-triggered flip-flop 144_2. Thus, the decelerating control logic 142 may generate the control signal RCTRL according to the mask signal MASK and the receiving clock signal DQSDIV4.

Figure 4:
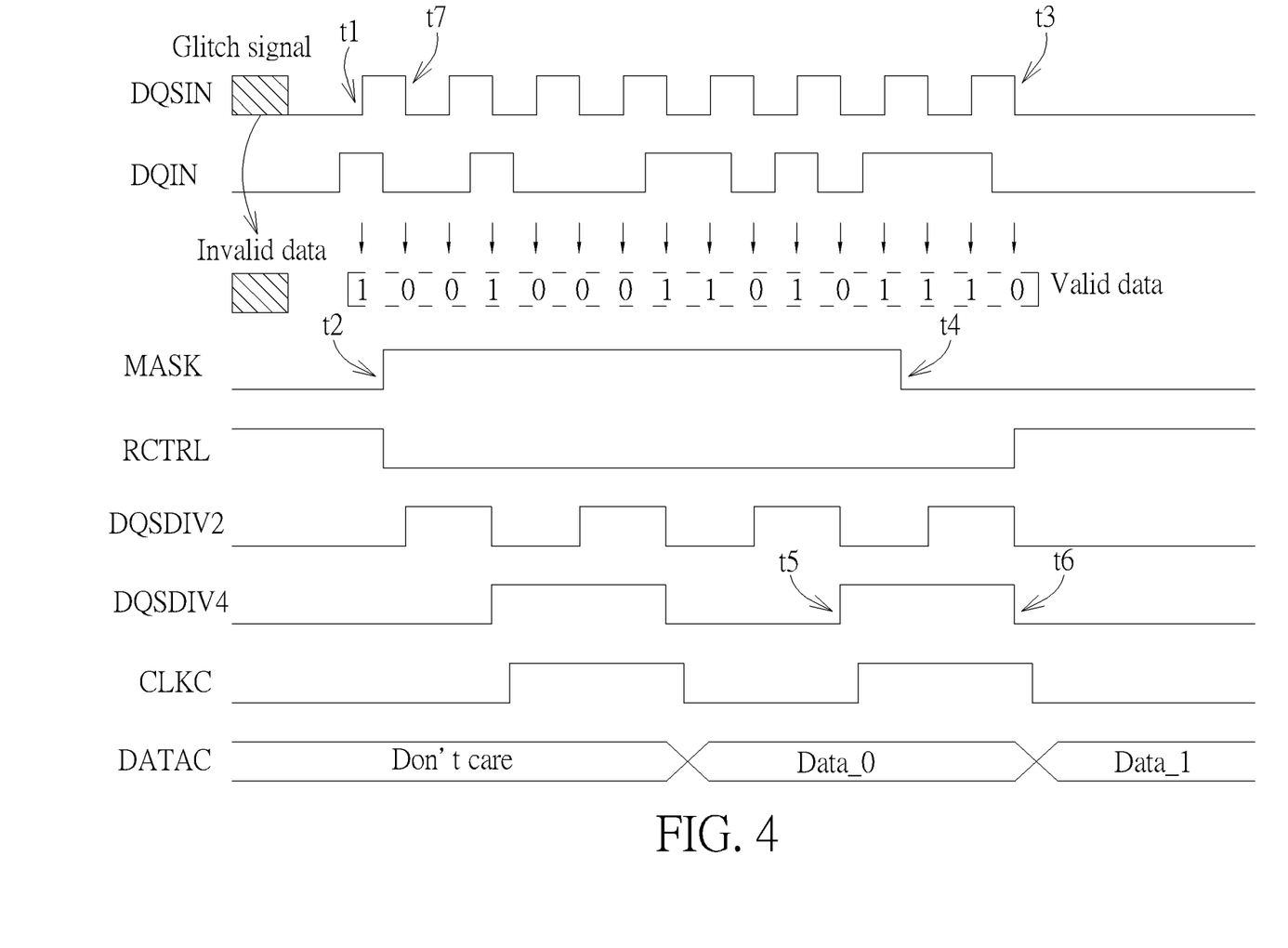
FIG. 4 is a timing diagram illustrating operations of the memory controller shown in FIG. 2 and the clock control logic shown in FIG. 3 according to an embodiment of the present invention.

FIG. 4 is a timing diagram illustrating operations of the memory controller 100 shown in FIG. 2 and the clock control logic 140 shown in FIG. 3 according to an embodiment of the present invention. Assuming that the data signal DQIN totally comprises sixteen bits of valid data in one read operation, the data strobe signal DQSIN comprises eight cycles of periodic square waveforms for latching the sixteen bits of valid data. It should be noted that an enablement period (e.g. a period of high logic level) of the mask signal MASK may be shorter than a period in which the data strobe signal DQSIN operates as a periodic signal (e.g. the period of the eight cycles of periodic square waveforms). More particularly, a starting time point (e.g. a time point t2) of the enablement period of the mask signal MASK may be later than a time point (e.g. a time point t1) at which the data strobe signal DQSIN is used for latching a first bit of the valid data, and an ending time point (e.g. a time point t4) of the enablement period of the mask signal MASK may be earlier than a time point (e.g. a time point t3) at which the data strobe signal DQSIN is used for latching a last bit of the valid data, where the time points t2 and t4 (which defines the enablement period of the mask signal MASK) are for illustrative purposes only, and are not limitations of the present invention.

For better comprehension, please refer to FIG. 4 in conjunction with FIG. 2 and FIG. 3. Before the mask signal MASK changes from the low logic level into the high logic level, the decelerating control logic 142 may hold the control signal RCTRL at the high logic level to control the decelerating circuit 144 to keep outputting the low logic level. When the mask signal MASK changes from the low logic level into the high logic level, the decelerating control logic 142 may convert the control signal RCTRL from the high logic level into the low logic level to enable a frequency division function of the decelerating circuit 144, as shown by the clock receiving signals DQSDIV2 and DQSDIV4 in FIG. 4. When the mask signal MASK changes from the high logic level into the low logic level, as the receiving clock signal DQSDIV4 has changed from the low logic level into the high logic level at the time point t5, the second input terminal of the NOR gate 142_1 within the decelerating control logic 142 has changed from the low logic level into the high logic level, making the control signal RCTRL maintain at the low logic level after the mask signal MASK changes into the low logic level. After the receiving clock signal DQSDIV4 changes from the high logic level into the low logic level at the time point t6, the control signal RCTRL may return to the high logic level to control the decelerating circuit 144 to disable the frequency division function and hold the receiving clock signals DQSDIV2 and DQSDIV4 at the low logic level. As shown in FIG. 4, the memory controller 100 may directly utilize the data strobe signal DQSIN to latch a series of data of the data signal DQIN, where the series of data comprises invalid data that is latched according to glitch signals within the data strobe signal DQSIN and the valid data that is latched according to the eight cycles of periodic square waveforms within the data strobe signal DQSIN. As the receiving clock signals DQSDIV2 and DQSDIV4 are generated by performing frequency division upon the data strobe signal DQSIN, time points (e.g. the time point t6) of last falling edges of the receiving clock signals DQSDIV2 and DQSDIV4 are identical to a time point (e.g. the time point t3) of a last falling edge of the data strobe signal DQSIN in the eight cycles of periodic square waveforms, and the demultiplexer 150 may determine the portion of the valid data within the series of data according to the receiving clock signal DQSDIV2 and/or DQSDIV2 in a process of the series of data undergoing deceleration (e.g. undergoing a converting procedure of serial-to-parallel), to determine the valid data (e.g. data Data_0 and Data_1) within the series of data.

Taking the data strobe signal DQSIN and the data signal DQIN shown in FIG. 4 as an example, a related art needs to utilize a mask signal to perform gating upon the data strobe signal DQSIN to generate a gating output signal first, and then utilizes the gating output signal to latch a series of data within the data signal DQIN to guarantee that the whole series of data is valid. Thus, a starting time point of an enablement period of the mask signal of the related art has to be earlier than the time point t1, and an ending time point of the enablement period of the mask signal of the related art has to be later than the time point t3. In comparison with the related art, the mask signal of the memory controller 110 can have more tolerance. As the decelerating circuit 144 is implemented as a negative edge-triggered frequency divider, the starting time point of the enablement period of the mask signal MASK may be delayed to a time point (e.g. a time point t7) of a first falling edge of the data strobe signal DQSIN in the eight cycles of periodic square waveforms at most, and the ending time point of the enablement period of the mask signal MASK may be set ahead to a time point (e.g. the time point t5) of a last rising edge of the receiving clock signal DQSDIV4.

Implementations of the mask generating circuit 130 and the demultiplexer 150 in the aforementioned embodiments are not limited to specific logic circuits. Any circuit that can generate the mask signal MASK conforming to the above operation timing according to the data strobe signal DQSIN may be adopted in the mask generating circuit 130; and any circuit, after performing deceleration upon the series of data (which includes the invalid data and the valid data), that can utilize the signal (e.g. the receiving clock signals DQSDIV2 and/or DQSDIV4) generated by frequency division to find the valid data and transmit the valid data to the backend circuit(s), may be adopted in the demultiplexer 150. In addition, the decelerating circuit 144 takes a frequency divider with the functions of dividing-by-two and dividing-by-four, but the present invention is not limited to be implemented by a frequency divider with a specific divisor.

Figure 5:
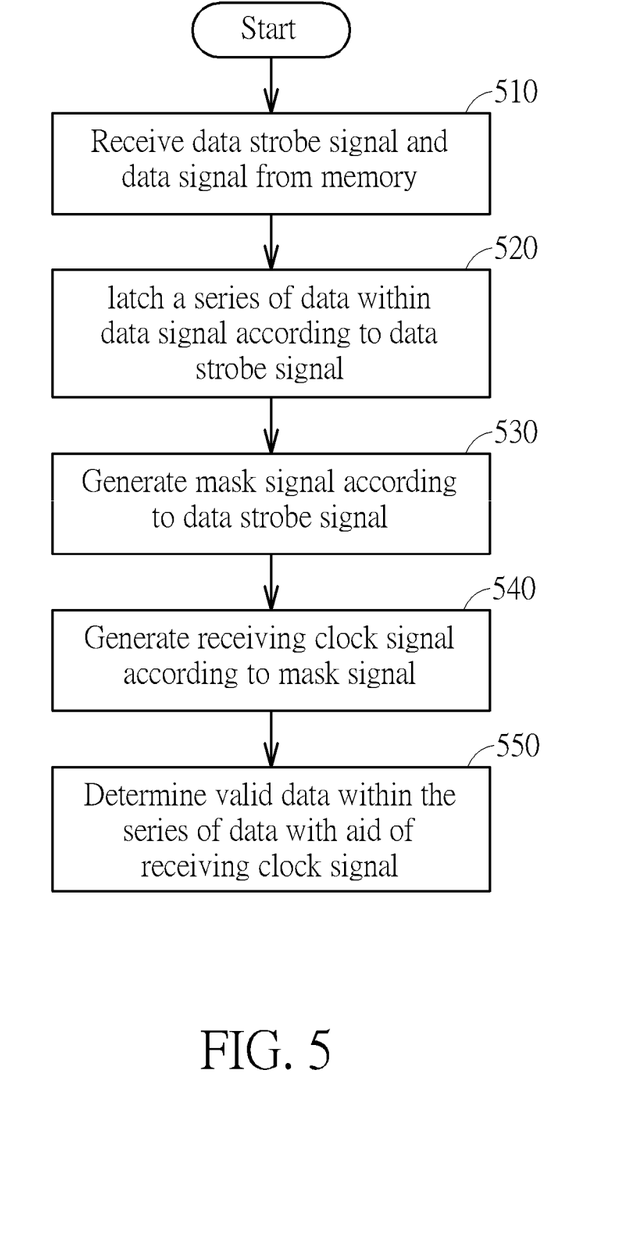
FIG. 5 is a working flow illustrating a method for read control of a memory according to an embodiment of the present invention.

Please refer to FIG. 5 in conjunction with FIG. 1, where FIG. 5 is a working flow illustrating a method for read control of a memory (e.g. the memory 50) according to an embodiment of the present invention. The working flow shown in FIG. 5 may be implemented by the memory controller 100 disclosed in embodiments of the present invention. It should be noted that the working flow shown in FIG. 5 is for illustrative purposes only, and is not a limitation of the present invention, where one or more steps may be added, deleted or modified in the working flow. In addition, if a same result may be obtained, these steps do not have to be executed in the exact order shown in FIG. 5.

In Step 510, the memory controller 100 may receive the data strobe signal DQS and the data signal DQ from the memory 50 through the receiving circuit 110, and generate the corresponding data strobe signal DQSIN and data signal DQIN.

In Step 520, the memory controller 100 may latch a series of data within the data signal DQIN according to the data strobe signal DQSIN.

In Step 530, the mask generating circuit 130 may generate the mask signal MASK according to the data strobe signal DQSIN (or DQS).

In Step 540, the clock control logic 140 may generate the receiving clock signal CLKR according to the mask signal MASK.

In Step 550, the demultiplexer 150 may determine the valid data within the series of data with aid of the receiving clock signal CLKR.

To summarize, the embodiments of the present invention provides a memory controller, a method for read control of a memory, and a storage system comprising the memory controller and the memory. The memory controller utilizes a data strobe signal to latch a series of data within a data signal first (regardless of whether invalid data is included or not), and then obtains valid data from the series of data after the series of data decelerates (e.g. undergoes frequency division). As the present invention does not need to utilize a mask signal to perform gating upon the data strobe signal before latching the series of data, the data delay problem of the related art can be solved. In addition, the mask signal for obtaining the valid data in the present invention can have more tolerance in comparison with the related art, so a probability of error caused by inaccuracy of timing of the mask signal can be greatly reduced, and overall performance can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory controller, comprising:
   a data latch circuit, configured to latch a series of data within a data signal from a memory according to a data strobe signal from the memory;
   a mask generating circuit, configured to generate a mask signal according to the data strobe signal;
   a clock control logic, electrically coupled to the mask generating circuit and configured to generate a receiving clock signal according to the mask signal; and
   a demultiplexer, electrically coupled to the data latch circuit and the clock control logic, configured to determine valid data within the series of data with aid of the receiving clock signal.

2. The memory controller of claim 1, wherein the clock control logic comprises:
   a decelerating control logic, configured to generate a control signal according to the mask signal; and
   a decelerating circuit, electrically coupled to the decelerating control logic, wherein the decelerating circuit generates the receiving clock signal by selectively making the data strobe signal decelerate according to logic states of the control signal.

3. The memory controller of claim 2, wherein:
   in response to a first logic state of the control signal, the decelerating circuit generates the receiving clock signal by making the data strobe signal decelerate; and
   in response to a second logic state of the control signal, the decelerating circuit controls the receiving clock signal to have a fixed logic state.

4. The memory controller of claim 2, wherein the decelerating control logic generates the control signal according to the mask signal and the receiving clock signal.

5. The memory controller of claim 2, wherein the decelerating circuit is a frequency divider.

6. The memory controller of claim 1, wherein the data latch circuit latches the series of data within the data signal according to rising edges and falling edges of the data strobe signal.

7. The memory controller of claim 1, wherein an enablement period of the mask signal is shorter than a period in which the data strobe signal operates as a periodic signal.

8. The memory controller of claim 1, wherein a starting time point of an enablement period of the mask signal is later than a time point at which the data strobe signal is used for latching a first bit of the valid data within the series of data.

9. The memory controller of claim 1, wherein an ending time point of an enablement period of the mask signal is earlier than a time point at which the data strobe signal is used for latching a last bit of the valid data within the series of data.

10. A method for read control of a memory, comprising:
   receiving a data strobe signal and a data signal from a memory;
   latching a series of data within the data signal according to the data strobe signal;
   generating a mask signal according to the data strobe signal;
   generating a receiving clock signal according to the mask signal; and
   determining valid data within the series of data with aid of the receiving clock signal.

11. The method of claim 10, wherein the step of generating the receiving clock signal according to the mask signal comprises:
   generating a control signal at least according to the mask signal; and
   generating the receiving clock signal by selectively making the data strobe signal decelerate according to logic states of the control signal.

12. The method of claim 11, wherein the step of generating the receiving clock signal by selectively making the data strobe signal decelerate according to the logic states of the control signal comprises:
   in response to a first logic state of the control signal, generating the receiving clock signal by making the data strobe signal decelerate; and
   in response to a second logic state of the control signal, controlling the receiving clock signal to have a fixed logic state.

13. The method of claim 11, wherein the step of generating the control signal at least according to the mask signal comprises:
   generating the control signal according to the mask signal and the receiving control signal.

14. The method of claim 11, wherein the step of generating the receiving clock signal by selectively making the data strobe signal decelerate comprises:
   generating the receiving clock signal by selectively performing frequency division upon the data strobe signal.

15. The method of claim 10, wherein the step of latching the series of data within the data signal according to the data strobe signal comprises:
   latching the series of data within the data signal according to rising edges and falling edges of the data strobe signal.

16. The method of claim 10, wherein an enablement period of the mask signal is shorter than a period in which the data strobe signal operates as a periodic signal.

17. The method of claim 10, wherein a starting time point of an enablement period of the mask signal is later than a time point at which the data strobe signal is used for latching a first bit of the valid data within the series of data.

18. The method of claim 10, wherein an ending time point of an enablement period of the mask signal is earlier than a time point at which the data strobe signal is used for latching a last bit of the valid data within the series of data.

19. A storage system, comprising:
   a memory, configured to store data; and
   a memory controller, electrically coupled to the memory and configured to perform read control of the memory, wherein the memory controller comprises:
      a data latch circuit, configured to latch a series of data within a data signal from the memory according to a data strobe signal from the memory;
      a mask generating circuit, configured to generate a mask signal according to the data strobe signal;
      a clock control logic, electrically coupled to the mask generating circuit and configured to generate a receiving clock signal according to the mask signal; and
      a demultiplexer, electrically coupled to the data latch circuit and the clock control logic, wherein the demultiplexer is configured to determine valid data within the series of data with aid of the receiving clock signal.

20. The storage system of claim 19, wherein the data latch circuit latches the series of data within the data signal according to rising edges and falling edges of the data strobe signal.

* * * * *

UNITED STATES PATENT AND TRADEMARK OFFICE
CERTIFICATE OF CORRECTION

PATENT NO. : 11,227,642 B2
APPLICATION NO. : 16/937539
DATED : January 18, 2022
INVENTOR(S) : Hsian-Feng Liu Page 1 of 1

It is certified that error appears in the above-identified patent and that said Letters Patent is hereby corrected as shown below:

On the Title Page

Item [30] insert:
--Jul. 30, 2019 (CN) .................... 201910693148.0--.

Signed and Sealed this
Seventeenth Day of May, 2022

Katherine Kelly Vidal
*Director of the United States Patent and Trademark Office*